United States Patent
Chang et al.

(10) Patent No.: US 10,868,081 B2
(45) Date of Patent: Dec. 15, 2020

(54) MEMORY DEVICES, CROSS-POINT MEMORY ARRAYS AND METHODS OF FABRICATING A MEMORY DEVICE

(71) Applicant: GLOBALFOUNDRIES Singapore Pte. Ltd., Singapore (SG)

(72) Inventors: Wei Chang, Singapore (SG); Eng Huat Toh, Singapore (SG); Shyue Seng Tan, Singapore (SG); Ruchil Kumar Jain, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/387,614

(22) Filed: Apr. 18, 2019

(65) Prior Publication Data

US 2020/0335552 A1 Oct. 22, 2020

(51) Int. Cl.
| | |
|---|---|
| *H01L 27/24* | (2006.01) |
| *H01L 29/66* | (2006.01) |
| *H01L 29/08* | (2006.01) |
| *H01L 29/861* | (2006.01) |

(52) U.S. Cl.
CPC ...... *H01L 27/2463* (2013.01); *H01L 27/2409* (2013.01); *H01L 27/2436* (2013.01); *H01L 29/66136* (2013.01); *H01L 29/66568* (2013.01); *H01L 29/0847* (2013.01); *H01L 29/861* (2013.01)

(58) Field of Classification Search
None
See application file for complete search history.

(56) References Cited

U.S. PATENT DOCUMENTS

| | | | | |
|---|---|---|---|---|
| 2014/0175551 | A1* | 6/2014 | Lin | H01L 27/0255 257/355 |
| 2016/0322426 | A1* | 11/2016 | Ramaswamy | H01L 23/528 |
| 2017/0200769 | A1* | 7/2017 | Bertin | H01L 29/861 |
| 2018/0019318 | A1* | 1/2018 | An | G06F 11/079 |
| 2019/0305043 | A1* | 10/2019 | Carta | H01L 45/1233 |

OTHER PUBLICATIONS

Kim et al., "Advanced process technologies of 1S1R for High Density Cross Point ReRAM", 2015 Silicon Nanoelectronics Workshop (SNW), 2015, 2 pages, IEEE.

(Continued)

*Primary Examiner* — Steven M Christopher
(74) *Attorney, Agent, or Firm* — Viering Jentschura & Partner MBB

(57) ABSTRACT

According to various non-limiting embodiments a memory device may include a silicon-on-insulator layer having a conductivity of a first polarity, a first raised structure over the silicon-on-insulator layer, the second raised structure over the silicon-on-insulator layer, an dummy gate arranged between the first raised structure and the second raised structure, and a memory connected to the second raised structure. The first raised structure may have a conductivity of the first polarity, and the second raised structure may include a first diode layer having a conductivity of a second polarity opposite to the first polarity.

20 Claims, 15 Drawing Sheets

(56) References Cited

OTHER PUBLICATIONS

Lee et al., "Bipolar Resistive Switching Characteristics in Flexible Pt/MZT/Al Memory and Ni/NbO2/Ni Selector Structure", Journal of the Electron Devices Society, Feb. 2018, pp. 518-524, vol. 6, IEEE.
Luo et al., "Fully Beol Compatible TaOx-based Selector with High Uniformity and Robust Performance", 2016 IEEE International Electron Devices Meeting (IEDM), Dec. 2016, 4pages, IEEE.
Aluguri et al., "Overview of Selector Devices for 3-D Stackable Cross Point RRAM Arrays", Journal of the Electron Devices Society, Sep. 2016, pp. 294-306, vol. 4, No. 5, IEEE.
Liu, "ISSCC 2013 / Session 12 / Non-Volatile Memory Solutions / 12.1 A 130.7mm2 2-Layer 32Gb ReRAM Memory Device in 24nm Technology", 2013 IEEE International Solid-State Circuits Conference Digest of Technical Papers, Feb. 2013, 3 pages, IEEE.
Kim et al., "NbO2-based Low Power and Cost Effective 1S1R Switching for High Density Cross Point ReRAM Application", 2014 Symposium on VLSI Technology Digest of Technical Papers, 2014, 2 pages, IEEE.

\* cited by examiner

MEMORY DEVICES, CROSS-POINT MEMORY ARRAYS AND METHODS OF FABRICATING A MEMORY DEVICE

TECHNICAL FIELD

Various embodiments relate to memory devices, cross-point memory arrays and methods of fabricating a memory device.

BACKGROUND

Emerging memories, such as Resistive Random-Access Memory (ReRAM) and Phase-Change Random-Access Memory (PCRAM) may adopt the cross-point memory architecture. The cross-point memory architecture may include one selector for each resistor memory, i.e. the 1S1R structure, to achieve a compact cell size and to suppress sneak path current. The 1S1R structure may have a cell size of up to 40% smaller than a one-transistor-one-resistor (1T1R) structure. However, various selectors used for the 1S1R structure are not compatible with complementary metal-oxide-semiconductor (CMOS) fabrication processes. These selectors also typically suffer from low drivability, small on/off ratio, poor endurance, and limited processing temperature budget.

SUMMARY

According to various embodiments, there may be provided a memory device including: a silicon-on-insulator layer having a conductivity of a first polarity, a first raised structure over the silicon-on-insulator layer, a second raised structure over the silicon-on-insulator layer, a dummy gate arranged between the first raised structure and the second raised structure, and a memory cell connected to the second raised structure. The first raised structure may have a conductivity of the first polarity, and the second raised structure may include a first diode layer having a conductivity of a second polarity opposite to the first polarity.

According to various embodiments, there may be provided a method of fabricating a memory device, the method including: providing a silicon-on-insulator layer having a conductivity of a first polarity, providing a first raised structure and a second raised structure over the silicon-on-insulator layer where the first raised structure has a conductivity of the first polarity where the second raised structure includes a first diode layer having a conductivity of a second polarity opposite to the first polarity where an dummy gate is arranged between the first raised structure and the second raised structure, and connecting a memory cell to the second raised structure.

According to various embodiments, there may be provided a cross-point memory array including: a silicon-on-insulator layer having a conductivity of a first polarity; a first raised structure over the silicon-on-insulator layer, the first raised structure having a conductivity of the first polarity; a plurality of second raised structures over the silicon-on-insulator layer, each second raised structure including a first diode layer having a conductivity of a second polarity opposite to the first polarity; a dummy gate arranged between the first raised structure and one second raised structure; a plurality of further dummy gates arranged between every two second raised structures; and an array of memory cells, wherein each row of the array is connected to a respective bitline, and wherein each column of the array is connected to a respective wordline; wherein the first raised structure is connected to every bitline; and wherein each second raised structure is connected to a respective wordline.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

In the context of various embodiments, the phrase "cross-point array" may be but is not limited to being interchangeably referred to as a "cross-bar array".

According to various non-limiting embodiments, a memory array may include a plurality of selectors. The selectors may be simple and compact CMOS-compatible, silicon-on-insulator (SOI) based selectors. The memory array may include the selectors and resistive memories, arranged in a cross-bar array. Each selector may include a diode, for example, a PN diode, formed using by selective silicon epitaxy for source and drain, also referred herein as Rise Silicon Deposition (RSD), instead of by ion implantation. By forming the diode using RSD, the selector may be formed on SOI substrates used in existing processes. Each diode may be individually formed. Each selector may be separated from another selector by dummy gates of a transistor structure. Each selector may be connected to a resistive memory through various levels of metal layers. The selector may be embedded in SOI using RSD. The process of forming the selector may include one mask for tuning. The memory array may include bitlines and wordlines formed out of SOI.

Figure 1:
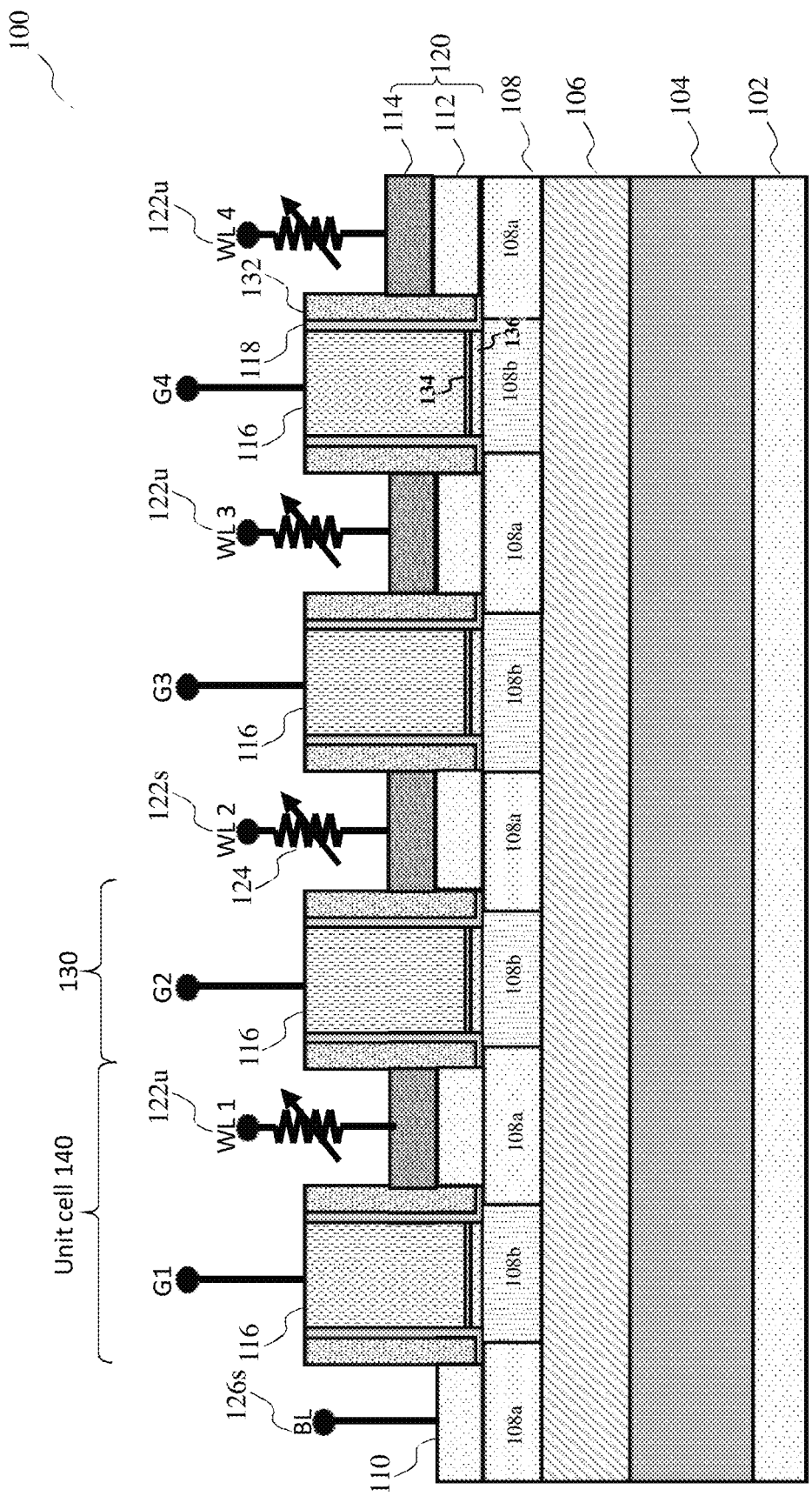
FIG. 1 illustrates a cross-sectional view of a memory device according to various non-limiting embodiments.

FIG. 1 illustrates a cross-sectional view of a memory device 100 according to various non-limiting embodiments. The memory device 100 may include a channel layer 108. The channel layer 108 may be a silicon-on-insulator (SOI) layer. The memory device 100 may further include a first raised structure 110 and a second raised structure 120 over the channel layer 108. Each of the first raised structure 110 and the second raised structure 120 may include RSD. The RSD may be n-type (nRSD) or p-type (pRSD). The first raised structure 110 may be doped to the same polarity as the channel layer 108. For example, the first raised structure 110 may include an nRSD. The channel layer 108 may be negatively-doped. The memory device 100 may also include a dummy gate 130, i.e. the gate of the transistor structure arranged between the first raised structure 110 and the second raised structure 120. The first raised structure 110 may have a conductivity of the same polarity as the channel layer 108. The second raised structure 120 may include a layer having a conductivity of opposite polarity to that of the channel layer 108. The memory device 100 may include at least one unit cell 140. The size of the unit cell 140 may be substantially smaller as compared to a unit cell of a 1T1R memory array, since shallow trench isolation (STI) may not be required between devices at the same bitline. The gate length may be in a range of between 14 nm to 40 nm.

Each unit cell 140 may include one dummy gate 130, one second raised structure 120 adjoining the dummy gate 130, and a memory 124 connected to the second raised structure. Each unit cell 140 may be separated from another unit cell by a respective dummy gate 130. The second raised structure 120 may include a diode, or may form a diode with the channel layer 108. For example, the second raised structure 120 may include a first diode layer 112 which is negatively doped (nRSD) and a second diode layer 114 which is positively doped (pRSD) such that the second raised structure 120 forms a PN diode. The diode may function as a switch for controlling current flow to the memory 124. The diode may limit current flow to a single direction between the first raised structure 110 and the second raised structure 120. The channel layer 108 may include lightly doped regions 108b and heavily doped regions 108a. The lightly doped regions 108b may be adjacent to the dummy gate 130; whereas, the heavily doped regions 108a may be adjacent to the first raised structure 110 or the second raised structure 120. The lightly doped regions 108b may be an n-type channel, while the heavily doped regions 108a may be n-type source or drain. The diode may be a selector configured to select a memory 124 of the memory device 100. The memory device 100 may include a selector for every memory 124. The selector may include semiconductor material. The selector may include a silicon-on-insulator (SOI) structure which may be compatible with CMOS fabrication processes. The selector may have a high on/off ratio, better endurance, and a higher thermal budget than non-SOI selectors. For example, the on/off ratio of the selector may be more than 10 while the ON current achieved may be more than 10 MA/cm$^2$. For example, the thermal budget of the selector may be more than 400° C. The selector may also achieve good self-rectifying characteristics.

The memory device 100 may include a structure that is at least partially, structurally similar to a transistor, such as a field-effect transistor (FET), such as a metal-oxide-semiconductor FET (MOSFET). Thus, the process of fabricating the memory device 100 may be similar to, or at least compatible with, the process of fabricating a transistor. The transistor structure may be non-functioning, so the transistor structure may also be referred herein as a mock transistor. For example, the first raised structure 110 may be the source or the drain of the transistor. The second raised structure 120 may be the source or the drain of the mock transistor. Each of the first raised structure 110 and the second raised structure 120 may be formed as raised source/drain of a transistor. The dummy gate 130 may include a centre portion 116 which may include poly silicon, or a metal. The transistor structure may be used to accommodate the PN diode. The transistor structure may be formed over a plurality of underlayers. The dummy gate 130 may further include an inner spacer 118 at least substantially surrounding the centre portion 116. The inner spacer 118 may overlap two sides of the centre portion 116, and may extend partly onto the channel layer 108 and may abut the first or second raised structures 110 or 120. The dummy gate 130 may further include an outer spacer 132 at least substantially overlapping the inner spacer 118. Both the inner and the outer spacers 118 and 132 may include electrically insulating materials, for example, oxides and nitrides, for example, silicon oxide and silicon nitrides. In a non-limiting example, the inner spacer 118 may include an oxide while the outer spacer 132 may include a nitride. The dummy gate 130 may further include a bottom insulating layer 136 that lies adjacent, and in contact with, the channel layer 108. The bottom insulating layer 136 may be provided between the centre portion 116 and the channel layer 108. The bottom insulating layer 136 may include a dielectric such as an oxide material, for example silicon oxide. The bottom insulating layer 136 may have a high dielectric constant. The dummy gate 130 may further include a work function tuning metal 134 arranged between the centre portion 116 and the bottom insulating layer 136. Each dummy gate 130 may be connected to a voltage point. The plurality of under layers may include an insulating layer 106. The insulating layer 106 may include an electrical insulator material, such as silicon dioxide or sapphire. The insulating layer 106 may be a buried oxide (BOX) layer. The insulating layer 106 may be adjacent to the channel 108, such that the insulating layer 106 is in contact with the channel 108. The insulating layer 106 may be provided over a substrate 102. The substrate 102 may include a semiconductor material, such as silicon. The substrate 102 may include a doped region, referred herein as a well 104. The well 104 may be a P-type well, or may be an N-type well. The well 104 may be adjacent to the insulating layer 106.

The memory device 100 may be part of a cross-point memory array which will be described in further details with respect to FIG. 5. The memory array may include wordlines and bitlines arranged for addressing a memory 124 of the memory array. The first raised structure 110 may be connected to a bitline 126, while the second raised structure 120 may be connected to a wordline 122 via the memory 124.

The memory 124 may be connected to the wordline 122. While FIG. 1 shows the memory device 100 as including four unit cells 140 in a row; however, the memory device 100 may include any quantity of unit cells 140 in a row. Also, it should be understood that FIG. 1 shows the cross-sectional view of the memory device 100 where only one row of the memory device 100 is visible. The memory device 100 may include more than one row, each row having more than one unit cell 140.

FIGS. 2A-2E illustrate cross-sectional views of various memory devices according to various non-limiting embodiments. These memory devices may be similar to the memory device 100, but with different arrangements of the first raised structure 110 and the second raised structure 120, i.e. the RSDs. Each of the RSDs may be single-layer or dual-layer. In a non-limiting embodiment, a dual-layer RSD may be used in conjunction with 22 nm node SOI technology where the bitline may not be able to connect to each memory 124 if the SOI substrate is thin; whereas, a single-layer RSD may be used in conjunction with thicker substrates. The single-layer RSD may be used for reverse type dopants. The RSDs may be formed by in situ doped epitaxy, or through epitaxy and ion implantation.

Figure 2A:
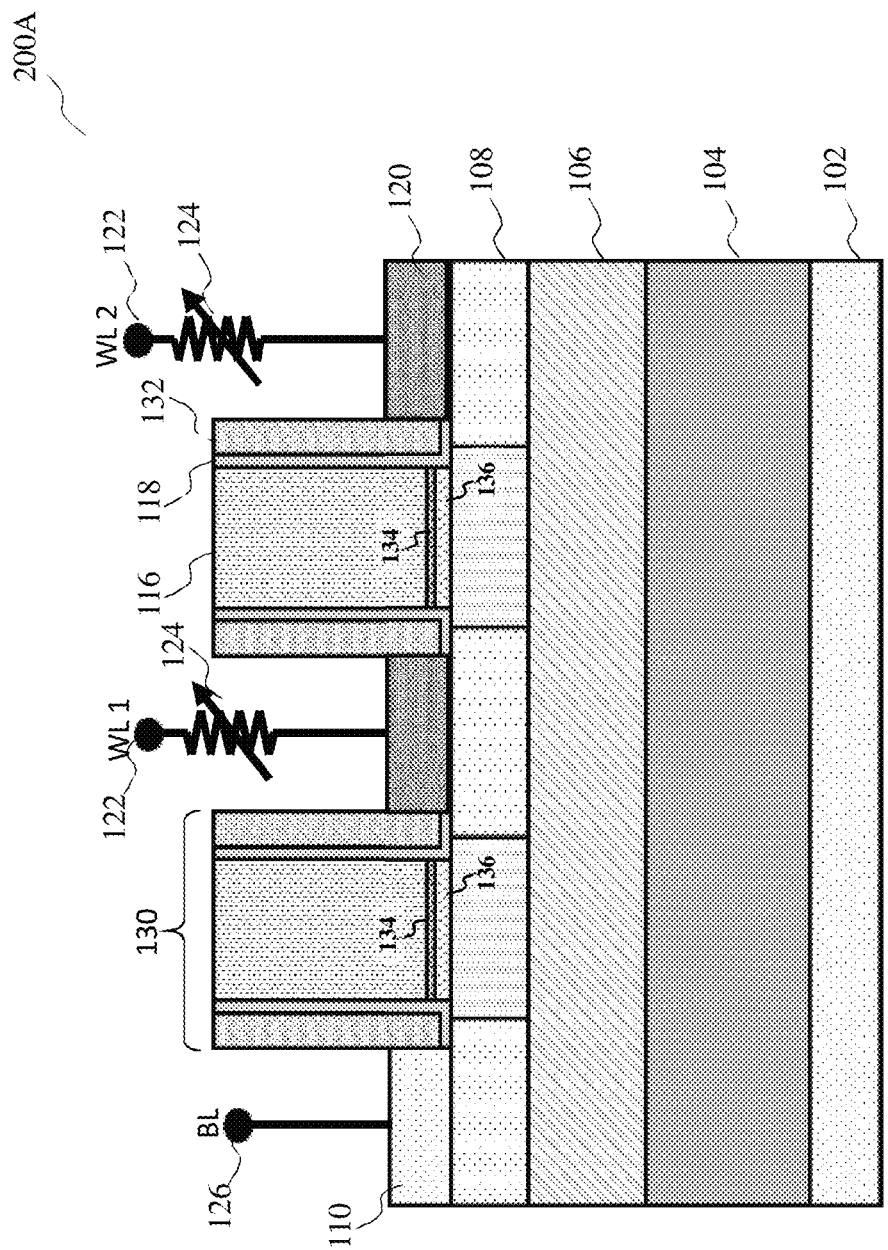
FIGS. 2A-2E illustrate cross-sectional views of various memory devices according to various non-limiting embodiments.

FIG. 2A illustrates a memory device 200A according to various non-limiting embodiments. The memory device 200A may be similar to the memory device 100, except that the second raised structure 120 may be a single-layer RSD. The second raised structure 120 may include a RSD that is doped to an opposite polarity from the channel layer 108. For example, the second raised structure 120 may be a pRSD while the channel layer 108 may be negatively-doped, such that the second raised structure 120 forms a PN diode with the channel layer 108. In other words, the selector may have a P/N structure.

Figure 2B:
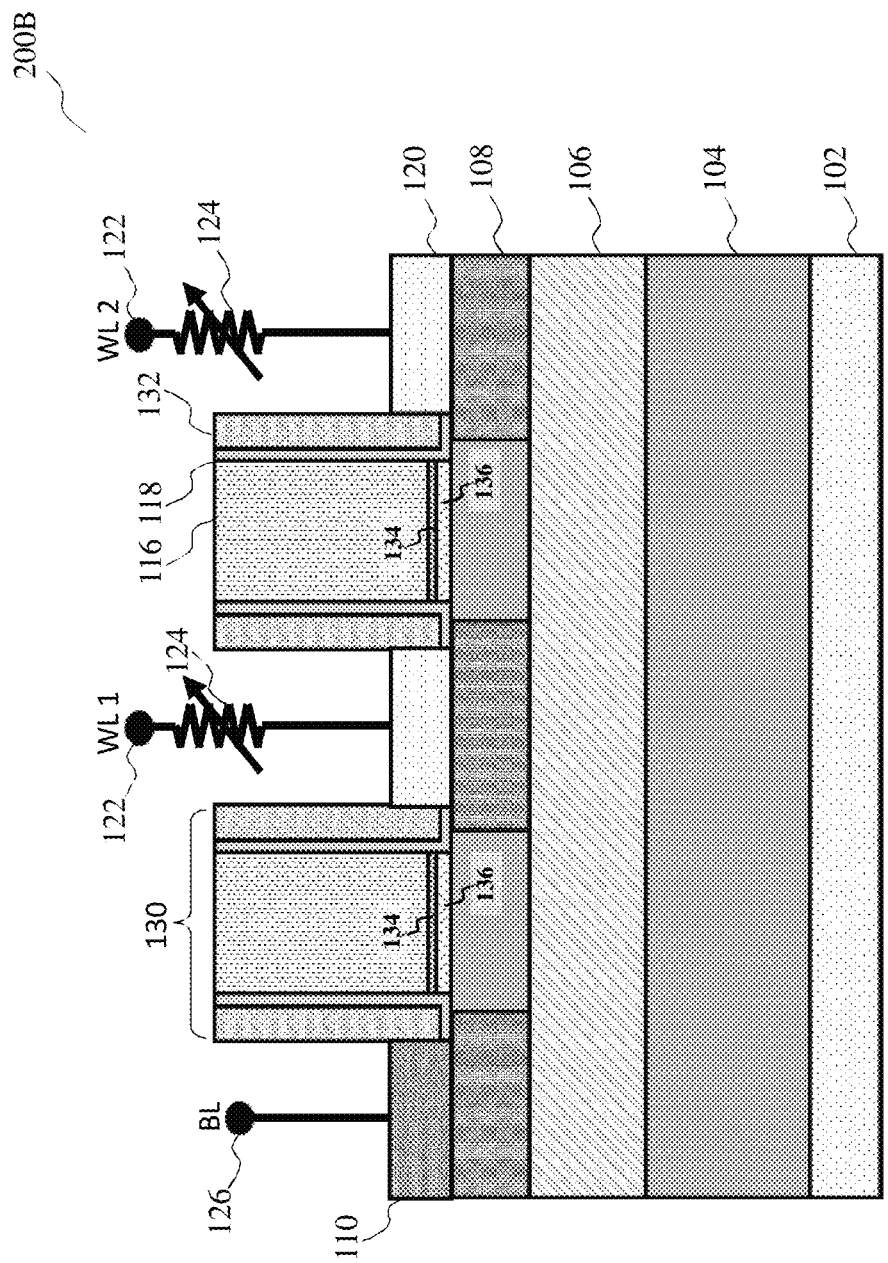

FIG. 2B illustrates a memory device 200B according to various non-limiting embodiments. The memory device 200B may be similar to the memory device 200A, except that the polarities of the first raised structure 110, the second raised structure 120 and the channel layer 108 may be reversed. The first raised structure 110 may be a pRSD. The second raised structure may be an nRSD. The channel layer 108 may be positively-doped. The second raised structure 120 may form a diode with the channel layer 108. The selector which includes the diode, may have an N/P structure.

Figure 2C:
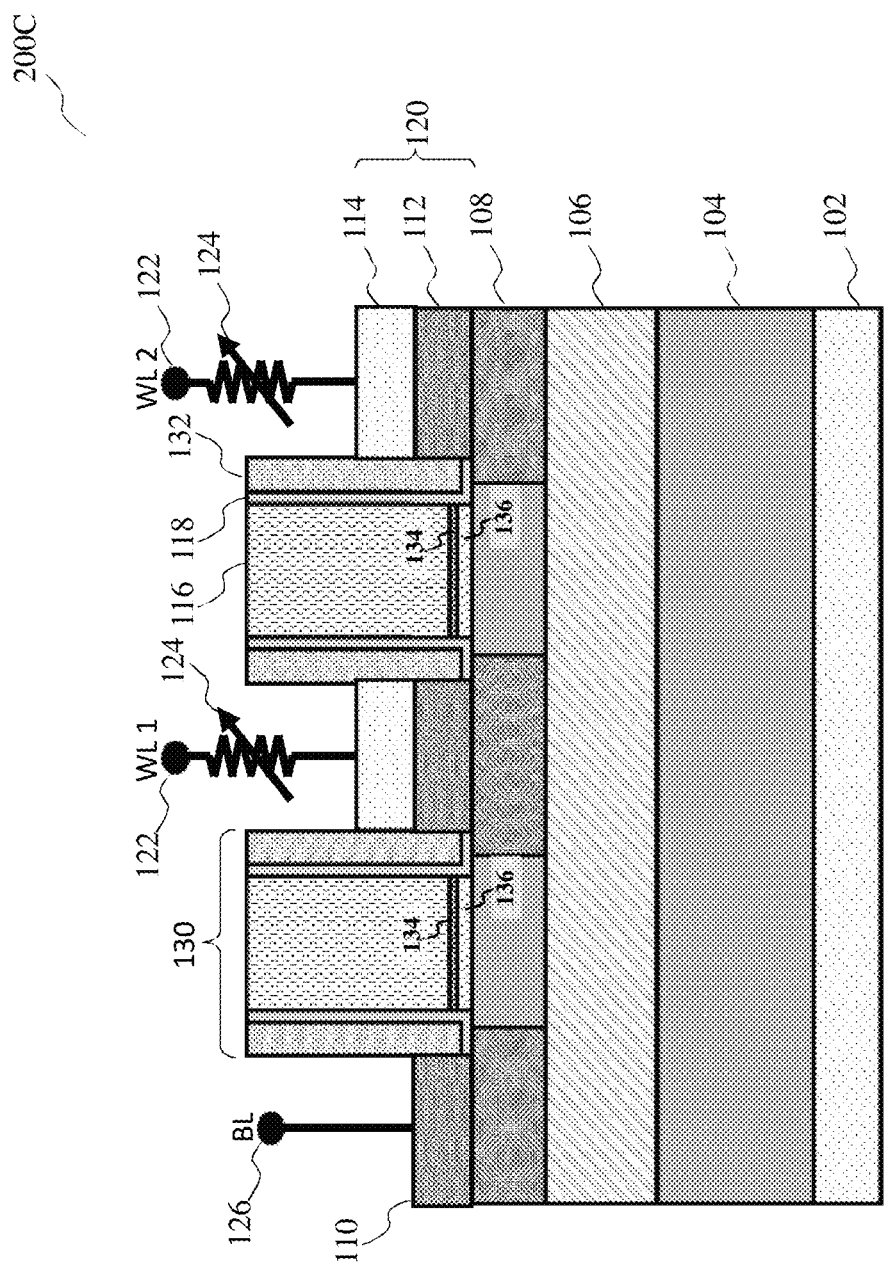

FIG. 2C illustrates a memory device 200C according to various non-limiting embodiments. The memory device 200C may be similar to the memory device 100, except that the polarities of the first raised structure 110, the second raised structure 120 and the channel layer 108 may be reversed. The first diode layer 112 may be a pRSD, while the second diode layer 114 may be an nRSD. The channel layer 108 may be positively-doped instead of negatively-doped. Like in the memory device 100, the second raised structure 120 may form a diode. The selector which includes the diode, may have an N/P structure.

Figure 2D:
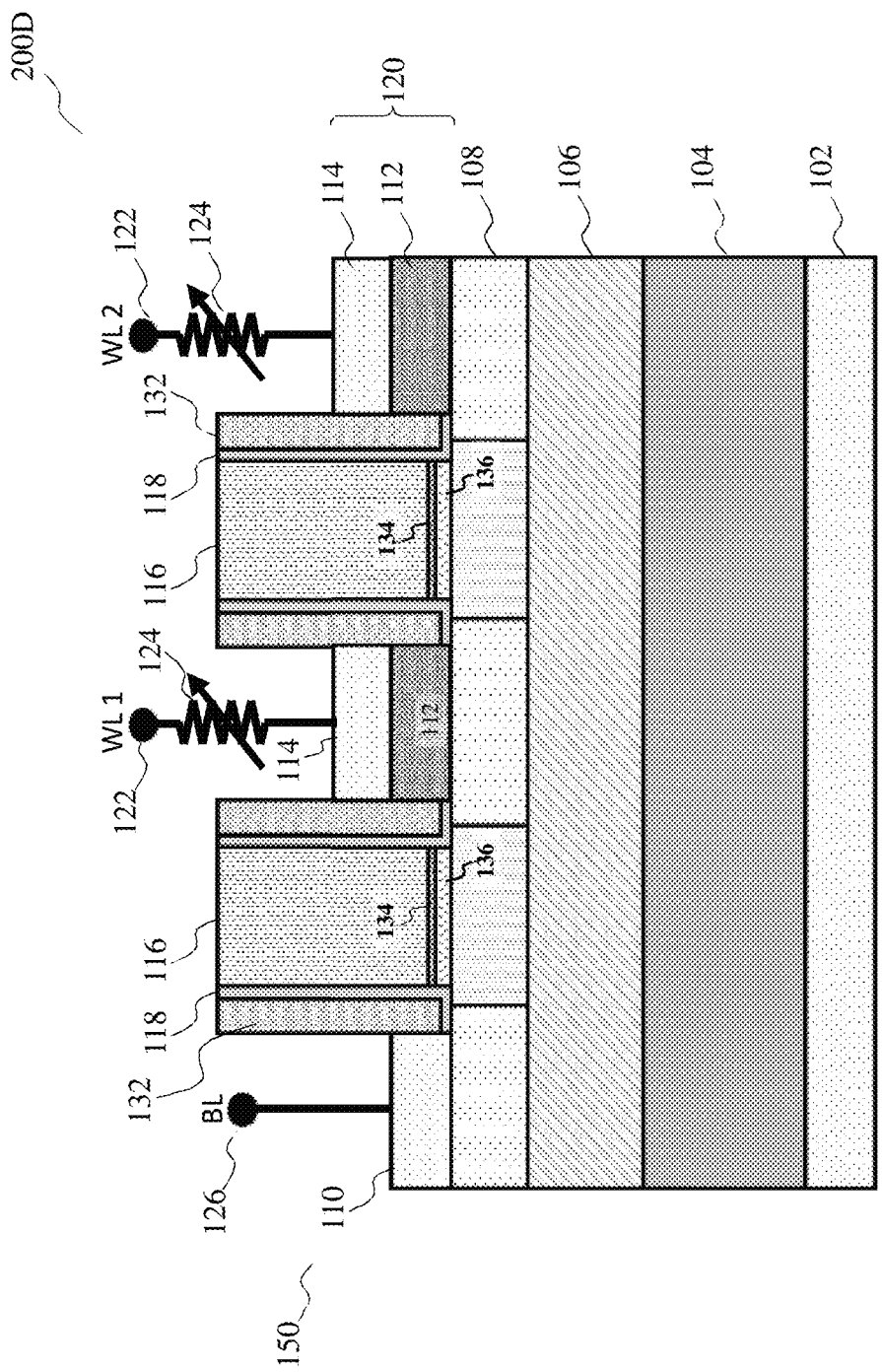

FIG. 2D illustrates a memory device 200D according to various non-limiting embodiments. The memory device 200D may be similar to the memory device 200C, except that the polarity of the channel layer 108 may be different. The channel layer 108 may be negatively-doped. The selector may include the N/P diode of the second raised structure 120, and may further include the channel layer 108. The selector may have an N/P/N structure.

Figure 2E:
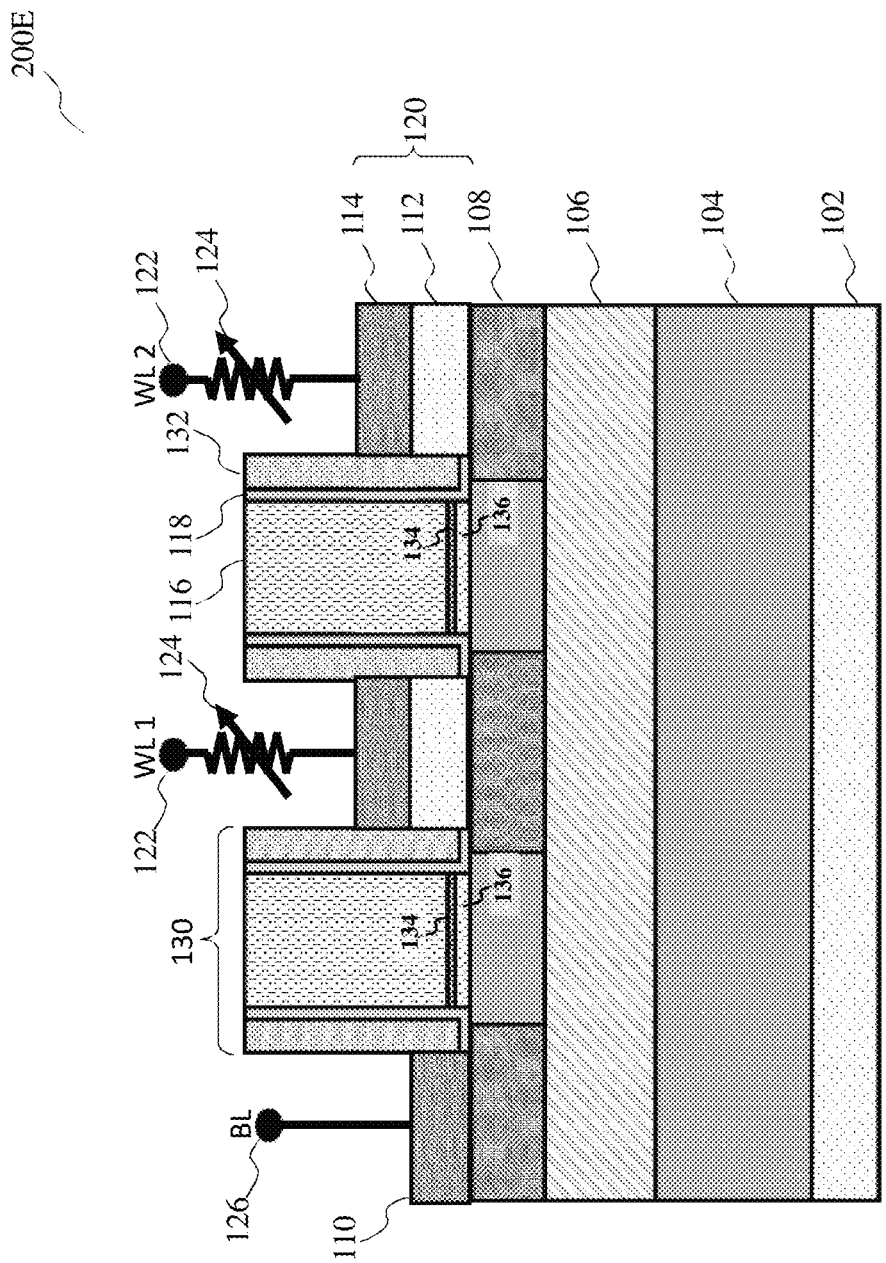

FIG. 2E illustrates a memory device 200E according to various non-limiting embodiments. The memory device 200E may be similar to the memory device 200D, except that the polarities of the first raised structure 110, the second raised structure 120 and the channel layer 108 may be reversed. The first raised structure 110 may be a pRSD. The second raised structure 120 may have a P/N structure. The channel layer 108 may be positively-doped. The selector may include the P/N diode of the second raised structure 120, and may further include the channel layer 108. The selector may have an P/N/P structure.

Figure 3A:
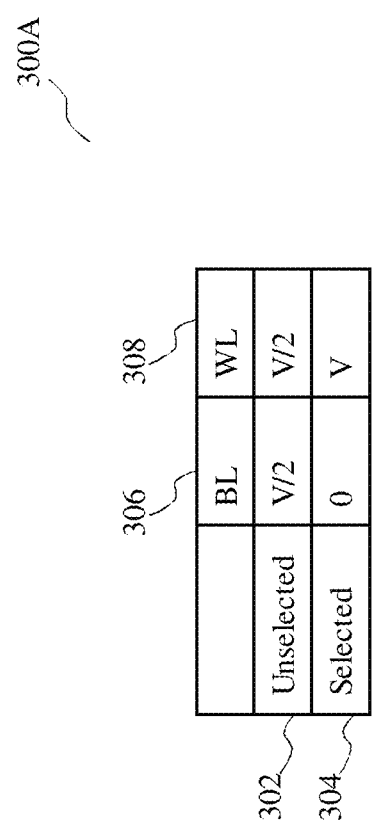
FIG. 3A illustrates a table listing an example of a bias condition for operating a cross-point memory array according to various non-limiting embodiments.

FIG. 3A illustrates a table 300A listing an example of a bias condition for operating a cross-point memory array according to various non-limiting embodiments. The table 300A includes a first row 302, a second row 304, a first column 306 and a second column 308. The first row 302 states the voltages applied to unselected bitlines and wordlines. The second row 304 states the voltages applied to selected bitlines and wordlines. The first column 306 states the voltages applied to the bitlines. The second column 308 states the voltages applied to the wordlines. In the example of table 300A, to select a memory, a voltage V is applied to the wordline connected to the memory and a zero voltage is applied to the bitline connected to the same memory. A voltage of V/2 is applied to all other wordlines and bitlines. Other bias conditions are possible, as long as the voltage across the selected memory is different from the voltage across the unselected memories.

Figure 3B:
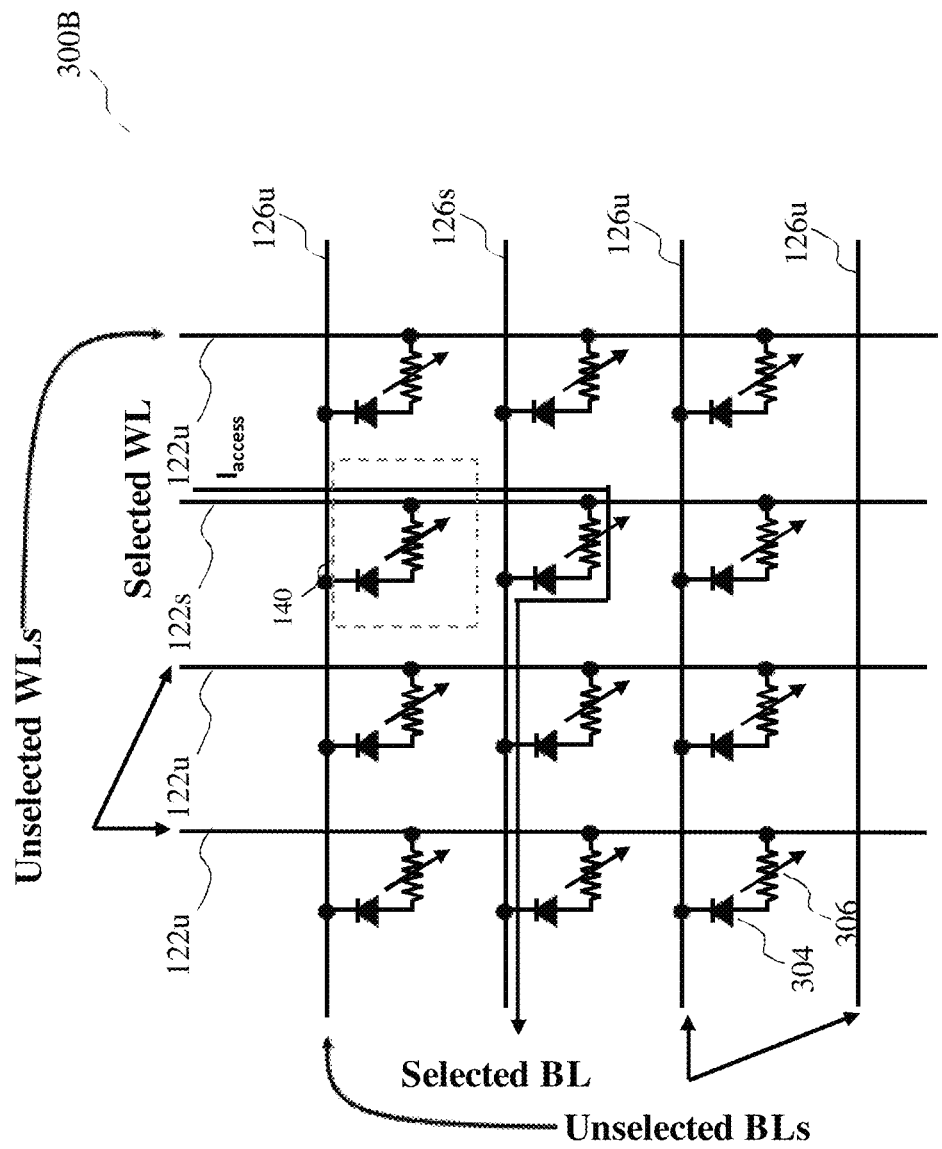
FIG. 3B illustrates a circuit diagram representing a cross-point memory array according to various non-limiting embodiments.

FIG. 3B illustrates a circuit diagram 300B representing a cross-point memory array according to various non-limiting embodiments. The cross-point array may include a plurality of unit cells 140. Each unit cell 140 may be connected to a respective bitline and wordline. Each unit cell 140 may include a diode 304 and a resistive element 306. The resistive element 306 may represent the memory 124. The diode 304 may represent the diode formed by the second raised structure 120, or by the second raised structure 120 together with the channel layer 108. Using the example of Table 300A, the selected wordline 122s may be supplied with a voltage of V and the selected bitline 126s may be supplied with a zero voltage, such that the voltage across a unit cell 140 may be V. The current may flow from the selected wordline 122s to the selected bitline 126s. The unselected bitlines 126s and the unselected wordlines 122u may be supplied with at least substantially equal voltages, such that the voltage across the unselected unit cells 140 may be close to zero, so that minimal current flows through the unselected unit cells 140. A sneak current may flow through the unselected unit cells 140, through a selected wordline 122s and a selected bitline 126s. The diodes 304 may limit the current to flow in a single direction to eliminate sneak effect. To reduce the sneak current, the dummy gates in the cross-point memory array may be biased. In a non-limiting example, the dummy gates of the current path of the selected memory 124 may be supplied with a half forward bias voltage, while the dummy gates of the non-current path of the selected memory 124 may be supplied with a half reverse bias voltage to ensure that the channel is off. The sneak current may be reduced by biasing the dummy gates of the selector.

FIGS. 4A-4E illustrate processes in a method for fabricating a cross-point memory array according to various non-limiting embodiments. The method may include forming bulk and/or SOI regions, forming dummy gates to isolate the selectors, forming n-type and p-type raised silicon deposition for the selectors; and forming resistive memories on top of the selectors. The method may further include forming wordlines and bitlines with metal connection, vias and metal layers. The method may further include back end of line (BEOL) processes.

Figure 4A:
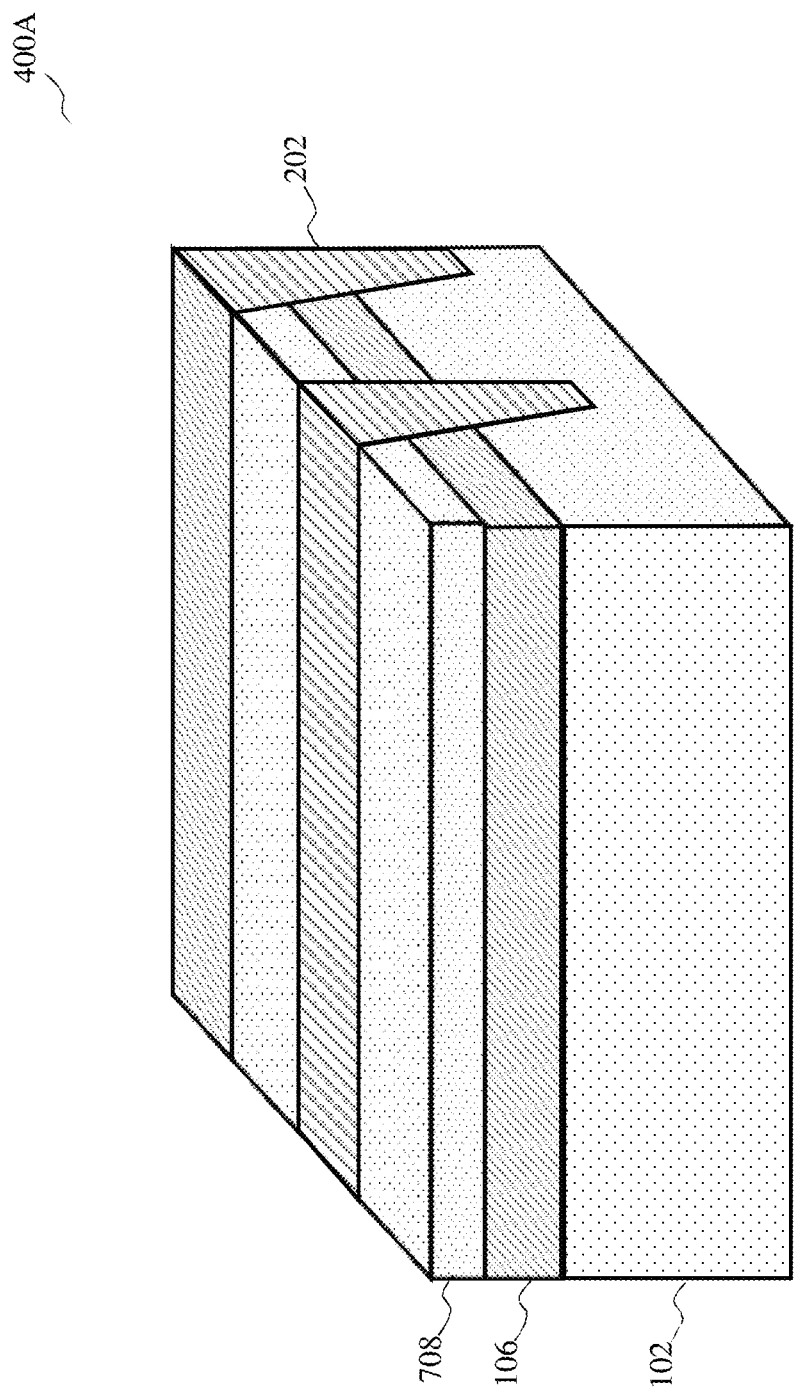
FIGS. 4A-4E illustrate processes in a method for fabricating a cross-point memory array according to various non-limiting embodiments.

FIG. 4A illustrates a process 400A. The process 400A may include providing a starting substrate, and forming a hybrid/isolation formation. The starting substrate may include a substrate 102, an insulating layer 106 which may include BOX, and a SOI layer 708. The method may further include forming shallow trench isolation (STI) 202 in the starting substrate. The STI 202 may extend from the SOI layer 708 to the substrate 102. The STI 202 may demarcate rows of the cross-point memory array, and may electrically isolate each row from adjacent rows. The STI 202 may be formed by etching the starting substrate, and depositing an insulating material, such as an oxide.

Figure 4B:
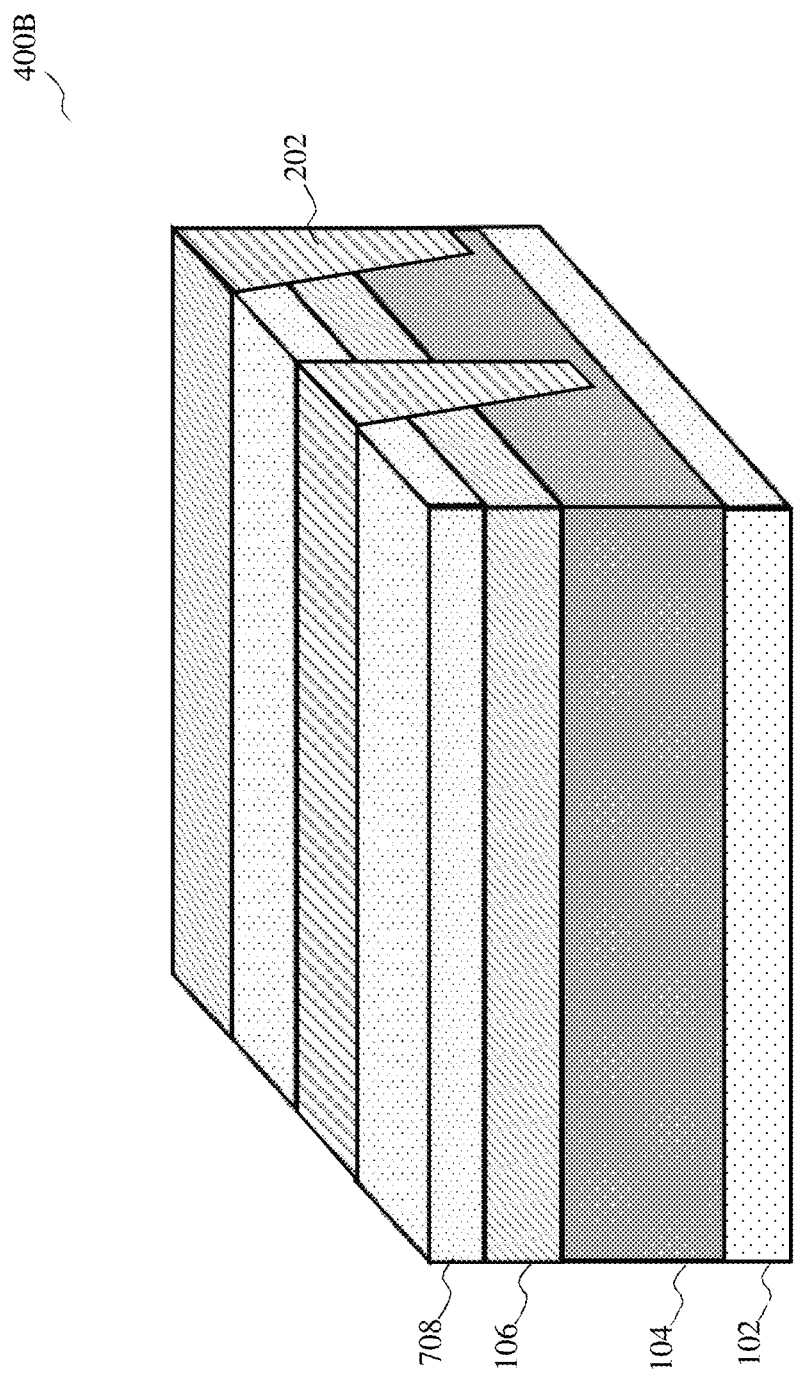

FIG. 4B illustrates a process 400B. The process 400B may include forming a well 104 in the substrate 102. The well 104 may be a P-type or N-type well. The well 104 may be formed under the insulating layer 106 and the well 104 may contact the insulating layer 106. The well 104 may be formed by ion implantation of the substrate 102.

Figure 4C:
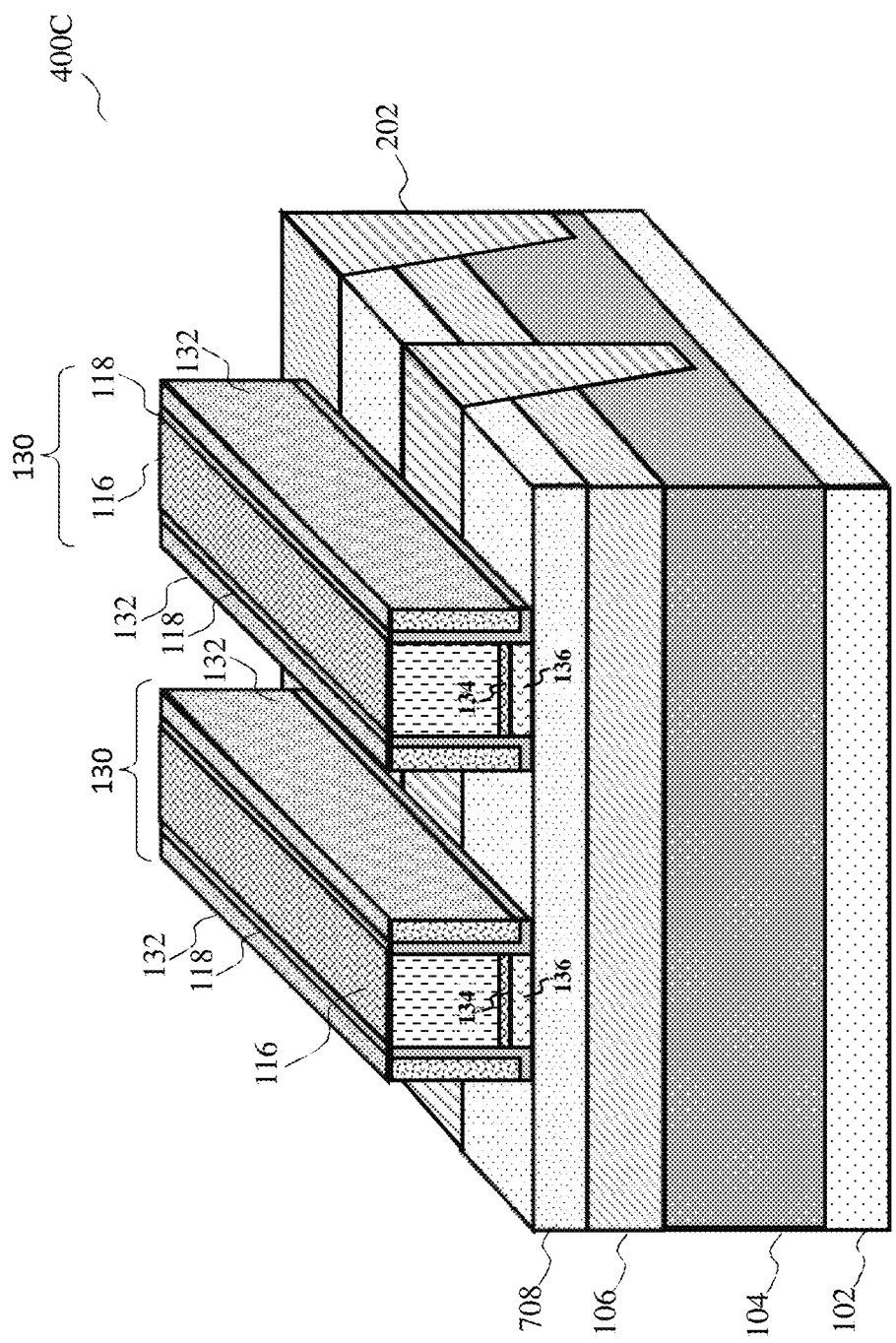

FIG. 4C illustrates a process 400C. The process 400C may include forming the dummy gate 130. Forming the dummy gate 130 may include forming centre portions 116, the inner spacer 118, and the outer spacer 132. The dummy gate 130 may demarcate columns of the cross-point memory array, and may electrically isolate each column from adjacent columns. The dummy gate 130 may isolate each selector, as well as isolate each unit cell. As a result, neighboring unit cells may be positioned closer, as compared to isolation by other means, such as using STIs. Further, the process of forming the dummy gate 130 may be aligned with CMOS fabrication processes, so that the dummy gate 130 may be formed in the same fabrication steps as CMOS fabrication, thereby reducing the number of masks and processes for fabricating a device that includes the memory array.

Figure 4D:
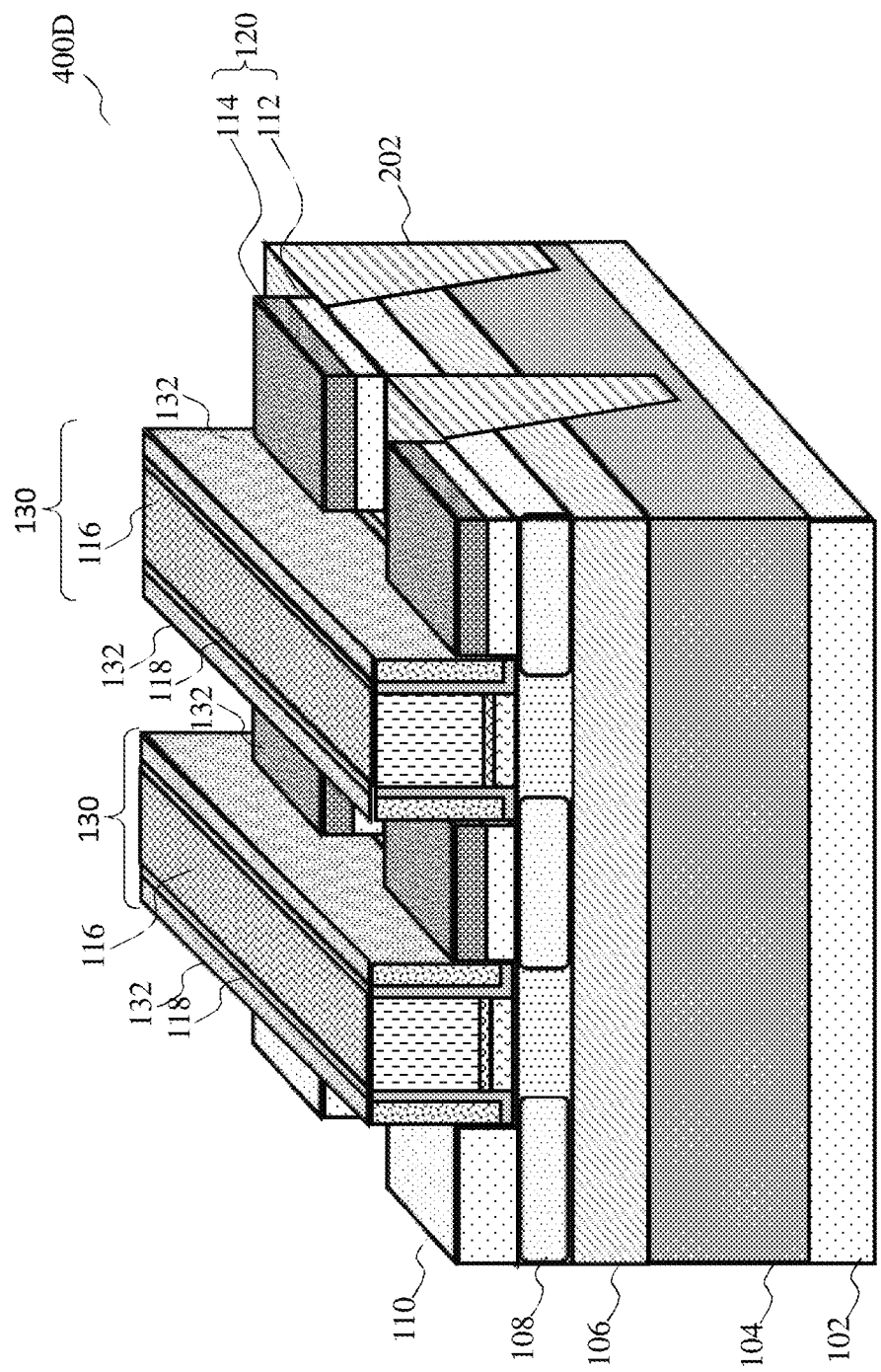

FIG. 4D illustrates a process 400D. The process 400D may include forming the first raised structure 110 and the second raised structure 120. The process 400D may include depositing a semiconductor material adjacent to the dummy gate 130, or between two neighboring dummy gate 130. The process 400D may further include doping the deposited semiconductor material, by in situ doping, to form n-type and p-type RSDs. The process 400D may also include forming the channel layer 108 by in situ doping or ion implantation of the SOI layer 708. The channel layer 108 may include an n-type channel which may be lightly doped, and an n-type source or drain which may be heavily doped.

Figure 4E:
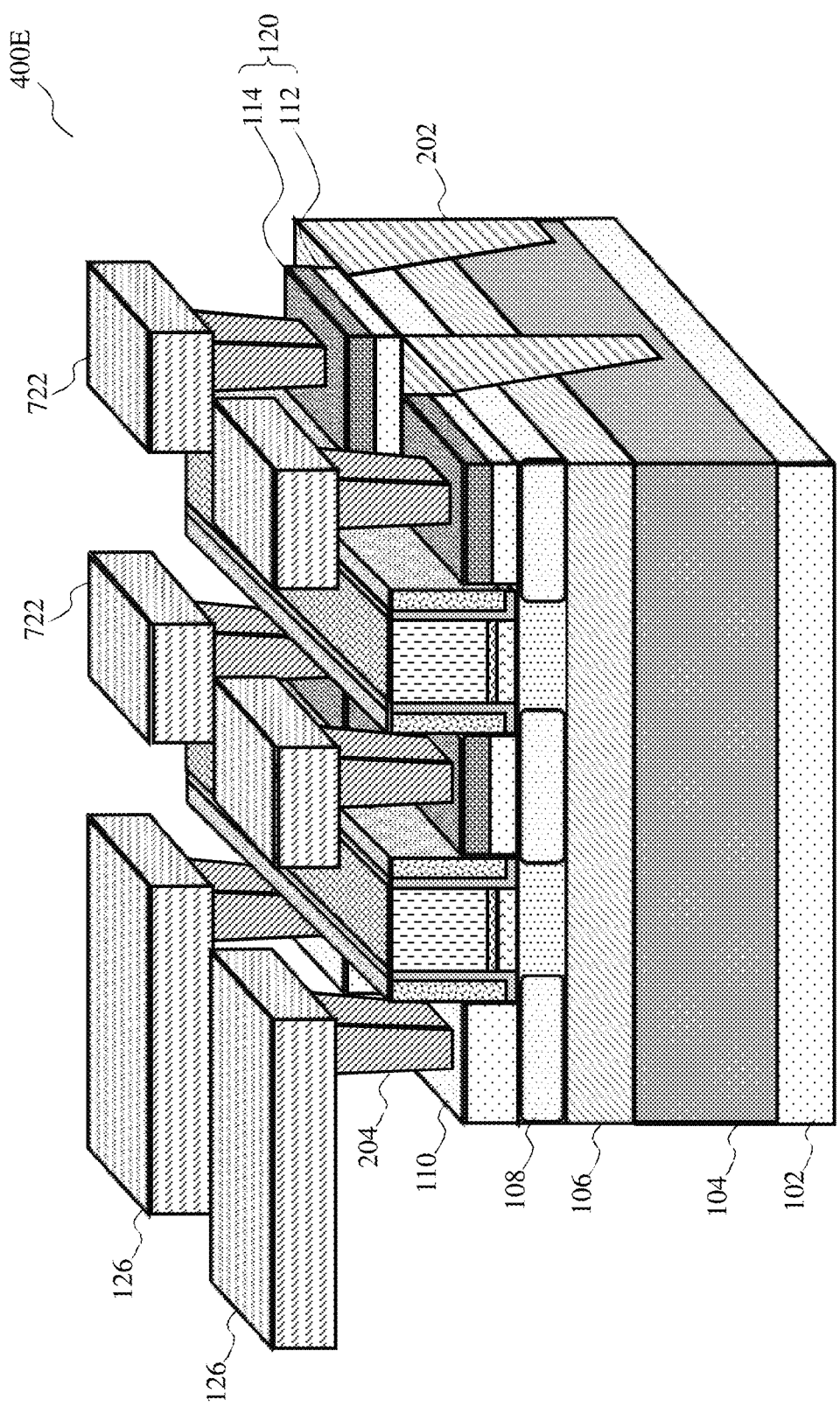

FIG. 4E illustrates a process 400E. The process 400E may include forming contact metals, including the electrical contacts 204 and metal parts 722. The process 400E may also include forming the bitlines 126. The electrical contacts 204 may include connections between the first raised structure 110 and the bitlines 126. The electrical contacts 204 may also include connections between the second raised structures 120 and the metal parts 722.

Figure 5:
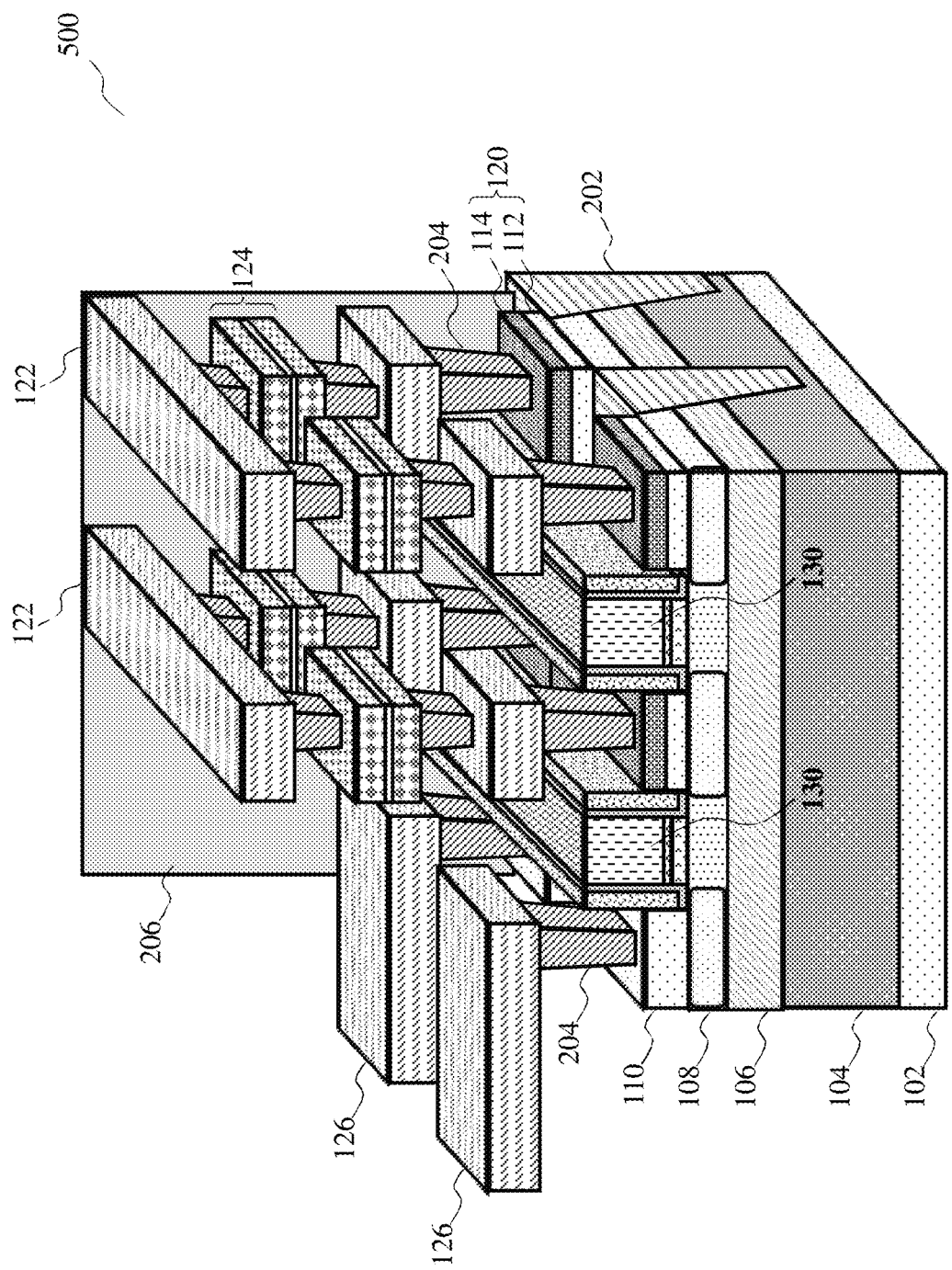
FIG. 5 illustrates a cross-point memory array according to various non-limiting embodiments.

The method for fabricating a cross-point memory array may further include forming ILD 206, the wordlines 122 and the memories 124, to form the cross-point memory array 500, which is described in further detail with respect to FIG. 5. The wordlines 122 may be connected to the metal parts 722.

FIG. 5 illustrates a cross-point memory array 500 according to various non-limiting embodiments. The cross-point memory array 500 may include the memory device 100 and further unit cells 140, arranged in a row. The cross-point memory array 500 may include a plurality of rows. Each row may be electrically isolated from the next row, for example, by a shallow trench isolation (STI) 202. The STI 202 may prevent electric current leakage between adjacent rows. The STI 202 may include an insulator material, such as an oxide or a nitride, for example silicon dioxide or silicon nitride. The cross-point memory array 500 may include a channel layer 108, a first raised structure 110 adjacent to the channel layer 108 and a plurality of second raised structures 120 also adjacent to the channel layer 108, dummy gate 130 arranged between every two raised structures. In other words, a dummy gate 130 may be arranged between the first raised structure 110 and a nearest second raised structure 120. In addition, a dummy gate 130 may be arranged between every two second raised structures 120. The cross-point memory array 500 may further include a plurality of memories 124, which may be arranged in a matrix, i.e. in rows and columns. Each row of memories 124 may be connected to a respective bitline 126 through a respective selector at the first raised structure 110, for example through an electrical contact 204. Each column of memories 124 may be connected to a respective wordline 122, for example by an electrical contact 204. In each row, each wordline 122 may be connected to a respective second raised structure 120. In other words, each memory 124 may be electrically connected to a respective bitline 126 and a respective wordline 122. The cross-point memory array 500 may address or select, a particular memory 124 for reading from or writing to, by providing a predetermined voltage across the wordline 122 and bitline 126 that are connected to the particular memory 124. The electrical contact 204 may include a metal. The cross-point memory array 500 may include an interlayer dielectric (ILD) 206. The ILD may isolate the unit cells, and also isolate each metal layer from the other metal layers such as the bitlines and wordlines.

According to various non-limiting embodiments, a memory device such as the memory device 100, or any one of 200A-200E may be provided. The memory device may include a selector. The memory device may include a channel layer, a first raised structure, a second raised structure, and a dummy gate. The channel layer may be the channel layer 108. The channel layer may have a conductivity of a first polarity. The first raised structure may be the first raised structure 110. The second raised structure may be the second raised structure 120. The first raised structure may be provided over the channel layer. The second raised structure may be provided over the channel layer. The selector may include the second raised structure 120, and may optionally include the channel layer. The dummy gate may be arranged between the first raised structure and the second raised structure. The dummy gate may include a semiconductor material surrounded by an insulating spacer. The semiconductor material may be part of the centre portion 116. The insulating spacer may include the inner spacer 118 and the outer spacer 132. The dummy gate may include an oxide region arranged adjacent to the channel layer. The oxide region may include the bottom insulating layer 136. The first raised structure may have a conductivity of the first polarity whereas the second raised structure may include a first diode layer that may have a conductivity of a second polarity. The second polarity may be opposite to the first polarity. The memory device may further include a memory, for example a resistive memory 124, connected to the selector at the second raised structure.

According to various non-limiting embodiments, a cross-point memory array such as the cross-point memory array 500 may be provided. The cross-point memory array may include a channel layer having a conductivity of a first polarity, such as the channel layer 108. The cross-point memory array may include a first raised structure such as the first raised structure 110, over the channel layer. The first raised structure may have a conductivity of the first polarity. The cross-point memory array may include a plurality of second raised structures such as the second raised structures 120, over the channel layer. Each second raised structure may include a first diode layer having a conductivity of a second polarity opposite to the first polarity. The cross-point memory array may include a dummy gate, such as the dummy gate 130, arranged between the first raised structure and one second raised structure. The cross-point memory array may include a plurality of further dummy gates arranged between every two second raised structures. The cross-point memory array may further include an array of memories, such as the memories 124. Each row of the array may be connected to a respective bitline, and each column of the array is connected to a respective wordline. The first raised structure may be connected to every bitline, while each second raised structure may be connected to a respective wordline.

Figure 6:
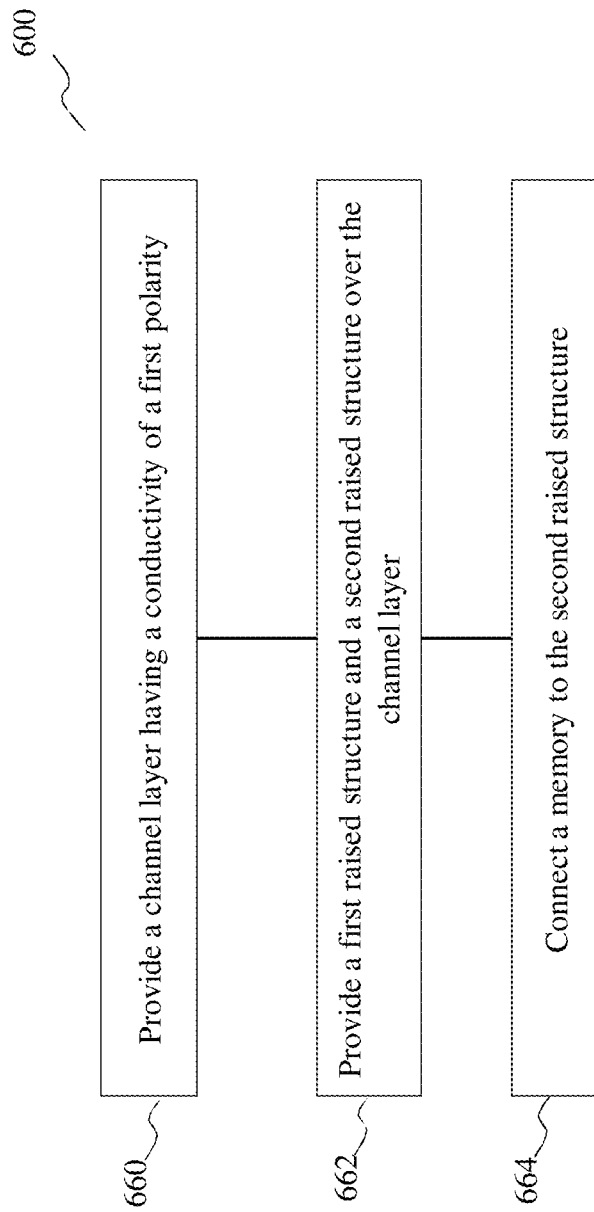
FIG. 6 illustrates a flow diagram of a method of fabricating a memory device according to various non-limiting embodiments.

FIG. 6 illustrates a flow diagram 600 of a method of fabricating a memory device according to various non-limiting embodiments. In element 662, a channel layer may be provided. The channel layer may have a conductivity of a first polarity. Element 662 may include, or may be part of process 400A. In element 664, a first raised structure and a second raised structure may be provided over the channel layer. The first raised structure may have a conductivity of the first polarity, and the second raised structure may include a first diode layer having a conductivity of a second polarity opposite to the first polarity. Element 664 may further include arranging a dummy gate between the first raised structure and the second raised structure. Element 664 may include, or may be part of, process 400C and process 400D. In element 664, a memory may be connected to the second raised structure.

The following examples pertain to further embodiments.

Example 1 is a memory device including: a silicon-on-insulator layer having a conductivity of a first polarity; a first raised structure over the silicon-on-insulator layer; a second raised structure over the silicon-on-insulator layer; and an dummy gate arranged between the first raised structure and the second raised structure; wherein the first raised structure has a conductivity of the first polarity; wherein the second raised structure includes a first diode layer having a conductivity of a second polarity opposite to the first polarity; and a memory connected to the second raised structure In example 2, the subject-matter of example 1 can optionally include that the memory cell is a resistive memory.

In example 3, the subject-matter of any one of examples 1 to 2 can optionally include an oxide layer under the silicon-on-insulator layer.

In example 4, the subject-matter of any one of examples 1 to 3 can optionally include that the second raised structure includes semiconductor material.

In example 5, the subject-matter of any one of examples 1 to 4 can optionally include that the memory device includes a structure of a transistor, wherein the first raised structure is a source of the transistor, and wherein the second raised structure is a drain of the transistor.

In example 6, the subject-matter of example 5 can optionally include that the transistor is a MOSFET.

In example 7, the subject-matter of any one of examples 1 to 6 can optionally include that the second raised structure further includes a second diode layer having a conductivity of the first polarity, wherein the first diode layer and the second diode layer form a diode.

In example 8, the subject-matter of any one of examples 1 to 7 can optionally include that the first diode layer and the silicon-on-insulator layer form a diode.

In example 9, the subject-matter of example 8 can optionally include that the diode limits a current flow to a single direction between the first raised structure and the second raised structure.

In example 10, the subject-matter of any one of examples 1 to 9 can optionally include that the memory is connected to a wordline, and wherein the first raised structure is connected to a bitline.

In example 11, the subject-matter of any one of examples 1 to 10 can optionally include that the dummy gate includes a semiconductor material surrounded by an insulating spacer.

In example 12, the subject-matter of any one of examples 1 to 11 can optionally include that the dummy gate includes an oxide region arranged adjacent to the silicon-on-insulator layer.

Example 13 is a method of fabricating a memory device, the method including: providing a silicon-on-insulator layer having a conductivity of a first polarity; providing a first raised structure and a second raised structure over the silicon-on-insulator layer, wherein the first raised structure has a conductivity of the first polarity, and wherein the second raised structure includes a first diode layer having a conductivity of a second polarity opposite to the first polarity; wherein an dummy gate is arranged between the first raised structure and the second raised structure; and connecting a memory to the second raised structure.

In example 14, the subject-matter of example 13 can optionally include that providing the first raised structure and the second raised structure includes: depositing a semiconductor material adjacent to the dummy gate; and doping the deposited semiconductor material.

Example 15 is a cross-point memory array including: a silicon-on-insulator layer having a conductivity of a first polarity; a first raised structure over the silicon-on-insulator layer, the first raised structure having a conductivity of the first polarity; a plurality of second raised structures over the silicon-on-insulator layer, each second raised structure including a first diode layer having a conductivity of a second polarity opposite to the first polarity; an dummy gate arranged between the first raised structure and one second raised structure; a plurality of further dummy gates arranged between every two second raised structures; and an array of memories, wherein each row of the array is connected to a respective bitline, and wherein each column of the array is connected to a respective wordline; wherein the first raised structure is connected to every bitline; and wherein each second raised structure is connected to a respective wordline.

In example 16, the subject-matter of example 15 can optionally include that each memory is a resistive memory.

In example 17, the subject-matter of any one of examples 15 to 16 can optionally include an oxide layer under the silicon-on-insulator layer.

In example 18, the subject-matter of any one of examples 15 to 17 can optionally include that each second raised structure further includes a second diode layer having a conductivity of the first polarity, wherein the first diode layer and the second diode layer forms a diode.

In example 19, the subject-matter of any one of examples 15 to 18 can optionally include that the first diode layer forms a PN diode with the silicon-on-insulator layer.

In example 20, the subject-matter of example 19 can optionally include that the diode limits a current flow to a single direction between the first raised structure and any one of the second raised structures.

In example 21, the subject matter of example 15 can optionally include that each second raised structure is a selector of a respective memory.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A memory device comprising:
   a silicon-on-insulator layer having a conductivity of a first polarity;
   a first raised structure over the silicon-on-insulator layer;
   a second raised structure over the silicon-on-insulator layer;
   a dummy gate arranged between the first raised structure and the second raised structure;
   wherein the first raised structure has a conductivity of the first polarity;
   wherein the second raised structure comprises a first diode layer having a conductivity of a second polarity opposite to the first polarity; and
   a memory connected to the second raised structure.

2. The memory device of claim 1, wherein the memory cell is a resistive memory.

3. The memory device of claim 1, further comprising an oxide layer under the silicon-on-insulator.

4. The memory device of claim 1, wherein the second raised structure comprises semiconductor material.

5. The memory device of claim 1, wherein the memory device comprises a structure of a transistor, wherein the first raised structure is a source of the transistor, and wherein the second raised structure is a drain of the transistor.

6. The memory device of claim 1, wherein the second raised structure further comprises a second diode layer having a conductivity of the first polarity, wherein the first diode layer and the second diode layer form a diode.

7. The memory device of claim 1, wherein the first diode layer and the silicon-on-insulator form a diode.

8. The memory device of claim 7, wherein the diode limits a current flow to a single direction between the first raised structure and the second raised structure.

9. The memory device of claim 1, wherein the memory is connected to a wordline, and wherein the first raised structure is connected to a bitline.

10. The memory device of claim 1, wherein the dummy gate comprises a semiconductor material surrounded by an insulating spacer.

11. The memory device of claim 1, wherein the dummy gate comprises an oxide region arranged adjacent to the silicon-on-insulator.

12. A method of fabricating a memory device, the method comprising:
   providing a silicon-on-insulator having a conductivity of a first polarity;
   providing a first raised structure and a second raised structure over the silicon-on-insulator, wherein the first raised structure has a conductivity of the first polarity, and wherein the second raised structure comprises a first diode layer having a conductivity of a second polarity opposite to the first polarity;
   wherein a dummy gate is arranged between the first raised structure and the second raised structure; and
   connecting a memory to the second raised structure.

13. The method of claim 12, wherein providing the first raised structure and the second raised structure comprises:

depositing a semiconductor material adjacent to the dummy gate; and doping the deposited semiconductor material.

14. A cross-point memory array comprising:
a silicon-on-insulator having a conductivity of a first polarity;
a first raised structure over the silicon-on-insulator, the first raised structure having a conductivity of the first polarity;
a plurality of second raised structures over the silicon-on-insulator, each second raised structure of the plurality of second raised structures comprising a first diode layer having a conductivity of a second polarity opposite to the first polarity;
a dummy gate arranged between the first raised structure and one second raised structure of the plurality of second raised structures;
a plurality of further dummy gates arranged between every two second raised structures of the plurality of second raised structures; and
an array of memories, wherein each row of the array is connected to a respective bitline, and wherein each column of the array is connected to a respective wordline;
wherein the first raised structure is connected to every bitline; and
wherein each second raised structure of the plurality of second raised structures is connected to a respective wordline.

15. The cross-point memory array of claim 14, wherein each memory is a resistive memory.

16. The cross-point memory array of claim 14, further comprising an oxide layer under the silicon-on-insulator.

17. The cross-point memory array of claim 14, wherein each second raised structure of the plurality of second raised structures further comprises a second diode layer having a conductivity of the first polarity, wherein the first diode layer and the second diode layer forms a diode.

18. The cross-point memory array of claim 14, wherein the first diode layer forms a diode with the silicon-on-insulator.

19. The cross-point memory array of claim 18, wherein the diode limits a current flow to a single direction between the first raised structure and any one of the second raised structures of the plurality of second raised structures.

20. The cross-point memory array of claim 14, wherein each second raised structure of the plurality of second raised structures is a selector of a respective memory.

* * * * *